United States Patent [19]
Kovacic

[11] Patent Number: 5,422,502
[45] Date of Patent: Jun. 6, 1995

[54] LATERAL BIPOLAR TRANSISTOR

[75] Inventor: Stephen J. Kovacic, Kanata, Canada

[73] Assignee: Northern Telecom Limited, Montreal, Canada

[21] Appl. No.: 163,645

[22] Filed: Dec. 9, 1993

[51] Int. Cl.$^6$ ............................................. H01L 29/72
[52] U.S. Cl. ..................................... 257/197; 257/19; 257/378; 257/557
[58] Field of Search ................ 257/197, 19, 378, 558, 257/557, 616

[56] References Cited

U.S. PATENT DOCUMENTS

| | | | |
|---|---|---|---|
| 4,771,013 | 9/1988 | Curran | 437/31 |
| 4,771,326 | 9/1988 | Curran | 357/34 |
| 5,006,912 | 4/1991 | Smith et al. | 357/34 |
| 5,081,517 | 1/1992 | Contiero et al. | 357/43 |
| 5,089,428 | 2/1992 | Verret et al. | 437/31 |
| 5,159,424 | 10/1992 | Morishita | 257/197 |
| 5,164,797 | 11/1992 | Thornton | 257/558 |
| 5,198,376 | 3/1993 | Divakaruni et al. | 437/32 |

FOREIGN PATENT DOCUMENTS 000373832 6/1990 European Pat. Off. .............. 257/19
1-14960 1/1989 Japan ................................ 257/378

OTHER PUBLICATIONS

R. People, "Physics and Applications of GexSi1-x/Si Strained-layer Heterostructures" IEEE Journal of Quantum Electronics, vol. 22, pp. 1696–1710 Sep. 86.

*Primary Examiner*—Mark V. Prenty
*Assistant Examiner*—Donald L. Monin
*Attorney, Agent, or Firm*—Angela C. de Wilton

[57] ABSTRACT

A lateral bipolar transistor is provided in which the active base region comprises a layer of a material providing a predetermined valence band offset relative to the emitter and collector regions, to enhance transport of carriers from the emitter to the collector in a lateral manner. In particular, a silicon hetero-junction lateral bipolar transistor (HLBT) is provided. The lateral bipolar transistor structure and method of fabrication of the transistor is compatible with a bipolar-CMOS integrated circuit. Preferably the base region comprises a silicon-germanium alloy or a silicon-germanium superlattice structure comprising a series of alternating layers of silicon and silicon-germanium alloy.

10 Claims, 4 Drawing Sheets

LATERAL BIPOLAR TRANSISTOR

FIELD OF THE INVENTION

This invention relates to a lateral bipolar transistor and a method of making a lateral bipolar transistor for an integrated circuit.

BACKGROUND OF THE INVENTION

In fabrication of silicon semiconductor based high speed integrated circuits, the integration of both CMOS (complementary metal oxide semiconductor transistors) and bipolar transistors to provide Bipolar-CMOS (BiC-MOS) VLSI integrated circuits is now well established for telecommunications applications requiring high speed, high drive, mixed voltage and analog-digital performance. However, there is considerable challenge in optimizing the performance of both CMOS and bipolar devices for integrated circuit fabricated with progressively reduced dimensions. A manufacturable fabrication process for minimum geometry integrated circuits must be provided without inordinately increasing the process complexity, i.e. the number of mask levels and process steps.

Bipolar transistors having an emitter-base-collector structure in either a vertical or a lateral configuration are known. Key parameters that must be reduced to increase switching speed are base width, base transport time, base resistance and base-collector capacitance.

In combining shallow junction CMOS transistors with bipolar transistors for a sub-micron BiCMOS VLSI integrated circuit, a vertical bipolar transistor is commonly used. For example, a vertical PNP bipolar transistor comprises a buried collector formed in a P type region of the substrate, a heavily N doped base region is provided in the substrate surface and an heavily P doped emitter region overlies an active base region, forming an emitter-base junction. Base contacts are provided to the base region of the substrate surface adjacent the active base region. Contact to the buried collector is made through a heavily P doped region (i.e. a sinker) extending to the substrate surface. A vertical bipolar transistor with a shallow base width may be obtained in a process compatible with forming shallow junctions for CMOS transistors. For example, a bipolar transistor with a base width of ~0.2 μm may be achieved by low energy ion implantation, or by diffusion of impurities from an overlying heavily doped layer.

On the other hand, a conventional lateral bipolar transistor differs in structure considerably from a vertical bipolar transistor. A typical PNP lateral bipolar transistor comprises a substrate on which is formed a P doped epitaxial layer. Heavily P doped regions are defined in the epitaxial layer to form an emitter and a collector. The latter are defined by ion implantation of surface regions. The active base region is provided by the N doped layer disposed between the emitter and the collector, the base width being defined by the lateral spacing of the emitter and the collector. A buried base contact is provided by an underlying heavily N doped base electrode region. Thus, in a lateral bipolar transistor of this structure, the base width is constrained to be larger than or equal to the minimum photolithographic resolution used in defining the implantation area for the emitter and collector regions. As an example, in a BiC-MOS integrated circuit formed by a 0.8 μm process, the base width of a lateral bipolar transistor would be ~4 times larger than the 0.2 μm base width typically obtained in a vertical bipolar transistor.

Furthermore, a conventional lateral bipolar transistor suffers poor efficiency because, when the emitter-base junction is forward biased, carriers are launched in all directions from the collector, not only towards the emitter, but also towards the substrate. In the layout of a conventional lateral transistor the collector is annular and encircles the emitter to improve the collector efficiency.

Various schemes have been investigated to improve the performance of lateral bipolar transistors, for example, as discussed in U.S. Pat. No. 5,081,517 to Contiero et al. (SGS-Thomson-Electronics) issued 14 Jan. 1992 entitled mixed technology integrated circuit comprising CMOS structure and efficient lateral bipolar transistors with a high early voltage and fabrication thereof". In a large dimensional lateral bipolar transistor, i.e. in a low density integration, the collector and emitter extend relatively deeply into the well region and the emitter current is efficiently collected by the collector. However, if a lateral bipolar transistor is integrated with a shallow junction MOSFET, and has a correspondingly shallow collector region, the collector efficiency may be very poor. In the lateral bipolar transistor of Contiero et al., a collector "extension" region of the lateral bipolar transistor is provided. The latter extends relatively deeply into the well region compared with a CMOS junction region, to intercept the emitter current and gather it to the collector, and thus improve collector efficiency. An annular diffusion region provides a collector which encircles the emitter region and thus increases the collector efficiency, and further reduces the proportion of the emitter current which is lost to the substrate.

In another approach, it is known to form trench based lateral PNP bipolar transistors in which an emitter is provided by a sidewall of a trench to increase the injecting area and provide a more efficient cross-section for a high performance PNP. For example, a method of forming higher performance lateral PNP transistor with buried base contact is described in U.S. Pat. No. 5,198,376 issued 30 Mar. 1993 to Divakaruni et al (IBM). However, provision of trenches adds to the number of processing steps, and the process is not as readily integrated into a BiCMOS process including shallow junction CMOS transistors.

SUMMARY OF THE INVENTION

Thus the present invention seeks to provide a lateral bipolar transistor structure, an integrated circuit including a lateral bipolar transistor and method of making a lateral bipolar transistor structure which overcomes or reduces the above mentioned problems.

According to one aspect of the present invention there is provided a lateral bipolar transistor for an integrated circuit, comprising: a semiconductor layer of a first conductivity type formed on a substrate; first and second heavily doped regions of a second conductivity type defined in the surface of the semiconductor layer and laterally spaced apart, said first and second heavily doped regions defining an emitter and a collector respectively of the lateral bipolar transistor; an active base region of the bipolar transistor comprising part of said semiconductor layer disposed between said emitter and collector, the active base region comprising at least one layer of a semiconductor alloy having a predetermined valence band offset relative to the heavily doped regions forming the emitter and the collector.

Thus a heterostructure lateral bipolar transistor is provided having a base region comprising an alloy material which provides a predetermined valence band offset. The base region may comprise e.g. a relatively narrow band gap material. The resulting band structure enhances transport of carriers from the emitter to the collector in a lateral manner through the alloy layer and increases lateral gain of the transistor. Advantageously, during operation, the hetero-offset results in the emitter-base junction, i.e. between the emitter and the alloy layer, being more strongly turned on and therefore injecting carriers into the alloy layer, and reducing injection of carriers in a direction away from the collector. Furthermore, carriers not emitted into the alloy layer tend to be drawn towards it by a strain field associated with the lattice mismatch between the semiconductor and the alloy layer. For example, where the semiconductor layer is silicon, and the alloy layer comprises a silicon-germanium alloy, $Si_xGe_{1-x}$, the composition of the alloy controls the band offset and presence of germanium in the alloy layer increases minority carrier mobility. Thus, the value of x may be selected to provide a predetermined band offset to control the characteristics of the resulting transistor.

Alternatively, the base region comprises a superlattice structure, for example, provided by a series of alternating thin layers of Si and SiGe alloy. By using a superlattice structure, the band gap structure may be tailored, to provide a desired band offset. Correspondingly, the band gap offset of the superlattice layers enhances carrier transport through the base region and mitigates problems with poor collector efficiency found in a conventional silicon based lateral bipolar transistor.

According to another aspect of the present invention there is provided an integrated circuit comprising a silicon heterostructure lateral bipolar transistor. Advantageously, the transistor is formed on a silicon semiconductor substrate and has a base region comprising a silicon-germanium alloy disposed between an emitter region and a collector region provided by laterally spaced apart regions comprising heavily doped silicon.

According to yet another aspect of the present invention there is provided a method of forming a lateral bipolar transistor comprising: providing an integrated circuit substrate having a having a lightly doped epitaxial semiconductor layer formed thereon of a first conductivity type; providing therein first and second heavily doped regions of a second conductivity type defining an emitter and a collector respectively; and providing in a region disposed between the emitter and the collector, an active base region comprising a layer of a semiconductor alloy providing a predetermined valence band offset.

Processes for forming the lateral bipolar transistors may be provided by steps compatible with known bipolar CMOS processes. Where the narrow band gap semiconductor alloy layer comprises a silicon germanium alloy, the latter may be provided by epitaxial growth in a method compatible with conventional CMOS process technology. Alternatively a silicon germanium layer may be provided by germanium implantation and annealing of a silicon layer. Where a base region with a tailored band gap structure is to be provided by silicon superlattice structure, e.g. a series of alternating very thin (10 Å to 30 Å thick) layers of silicon and silicon germanium alloy, the latter may be deposited by suitable known methods, e.g., molecular beam epitaxial (MBE) growth.

Thus an improved lateral bipolar transistor, an integrated circuit including a silicon heterostructure lateral bipolar transistor and a method of forming a lateral bipolar transistor are provided, in which the above mentioned problems are avoided or reduced.

BRIEF DESCRIPTION OF THE DRAWINGS

Embodiments of the invention will now be described by way of example, with reference to the accompanying drawings, in which.

DESCRIPTION OF THE PREFERRED EMBODIMENT

Figure 1:
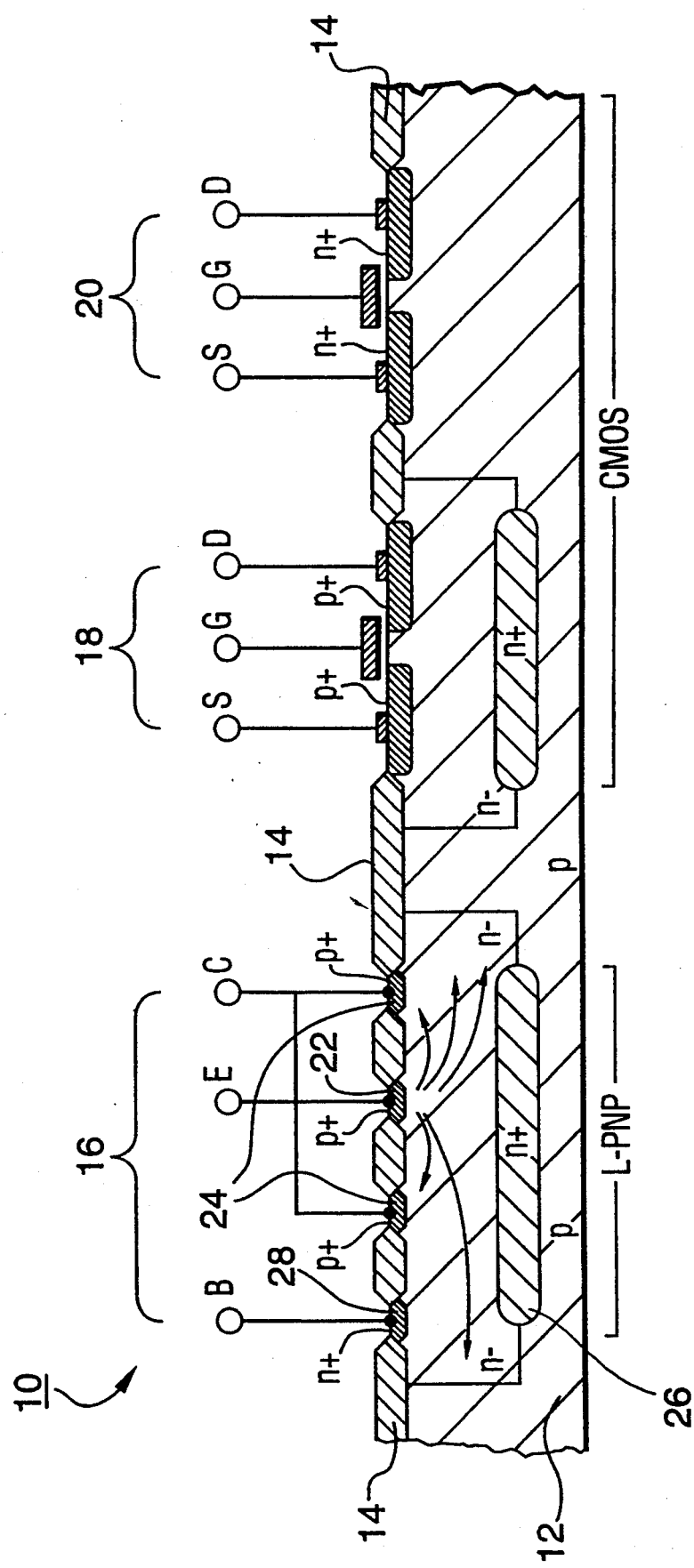
FIG. 1 shows a cross-sectional view of part of a conventional prior art integrated circuit including a lateral bipolar transistor and CMOS transistors.

Part of a known prior art BiCMOS integrated circuit 10 formed on a semiconductor substrate, i.e. part of a silicon wafer 12, is shown in FIG. 1. Openings through a field oxide layer 14 define device well regions of the substrate, in which are formed a conventional PNP lateral bipolar transistor structure 16, and conventional CMOS transistors 18 and 20. The lateral bipolar transistor 16 comprises and emitter region 22, an annular collector region 24 surrounding the emitter 22, and a buried base electrode 26 with a base contact 28 at the surface. When current from the emitter 20 is launched in all directions, as shown schematically by the arrows, although the annular collector 24 surrounds the emitter 22, a significant proportion of the current may be lost to the substrate. Consequently, the lateral bipolar transistor efficiency is poor.

Figure 2:
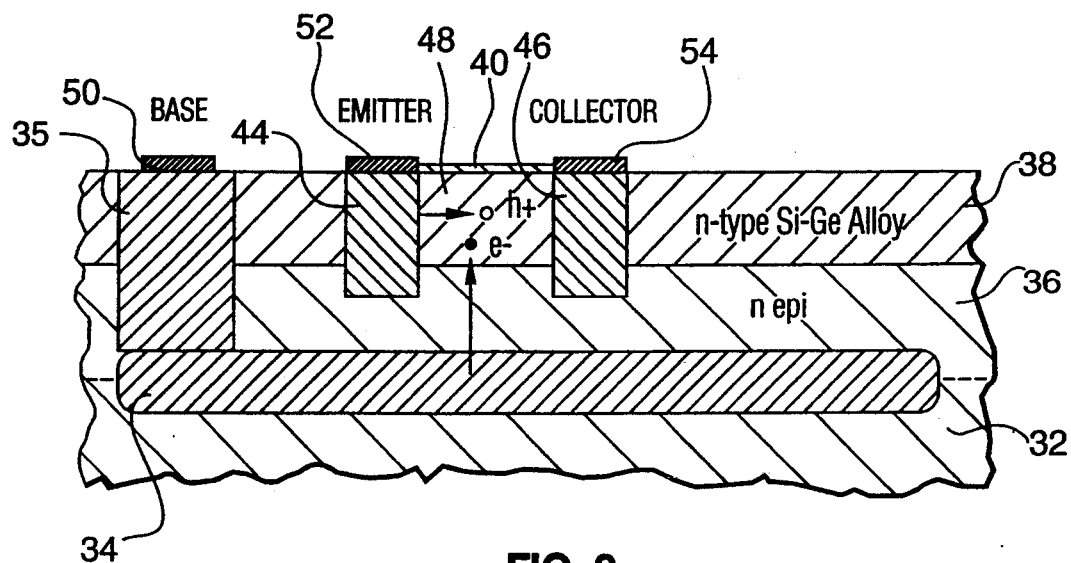
FIG. 2 shows schematic cross-sectional view through a lateral bipolar transistor comprising part of an integrated circuit according to a first embodiment of the present invention.

A lateral bipolar transistor 30 comprising part of an integrated circuit according to a first embodiment of the present invention is shown in FIG. 2. The transistor 30 is formed on a silicon substrate 32, e.g. a conventional silicon semiconductor wafer, shown in part in FIG. 2, having an overlying layer 36 of lightly N doped silicon, about 1 to 3 μm thick, and in which is selectively defined heavily doped N+ and P+ buried layers. The latter layers are incorporated in a manner conventional for BiCMOS integrated circuit manufacturing. FIG. 2 shows a N+ doped buried layer 34 only. Overlying the lightly doped silicon layer 36, there is provided about 500 Å–2000 Å of a layer 38 of lightly N doped silicon germanium alloy, that is, $Si_{1-x}Ge_x$, with $0<x<1$, the composition being selected to provided a predetermined band gap offset, dependent upon the specific design of the transistor as will be discussed below. Spaced apart, heavily doped P+ doped regions are defined in the surface region extending through the $Si_{1-x}Ge_x$ alloy layer to provide an emitter 44 and a collector 46 of the transistor 30, and so that an active base region 48 of the transistor is provided by the $Si_{1-x}Ge_x$ alloy layer extending between the emitter 44 and collector 46. Overlying the silicon germanium alloy layer 38 is provided a thin layer 40, about 50–300 Å thick, of dielectric, i.e. silicon dioxide. The latter also serves a gate oxide, e.g. in a CMOS portion of a BiCMOS integrated circuit (not shown). The resulting structure thus forms a silicon heterostructure lateral bipolar transistor 30 to which contacts 50, 52, and 54 to the base, emitter and collector respectively are provided.

Figure 3:
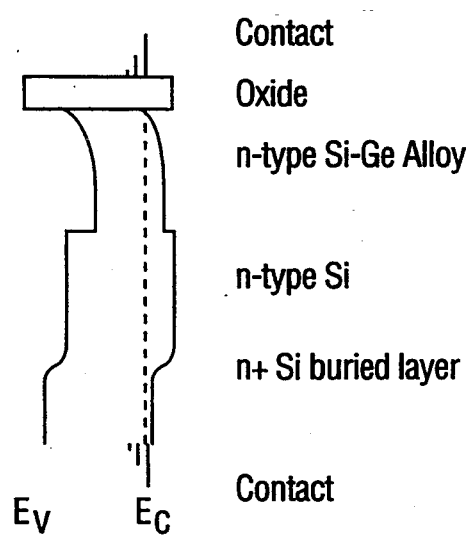
FIG. 3 shows an energy band diagram for the transistor of the first embodiment in a plane laterally through the emitter-base-collector i.e. extending through the Si—Ge alloy layer parallel to the surface.
Figure 4:
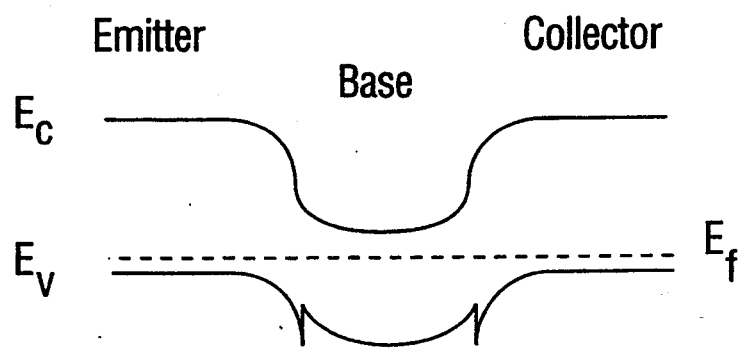
FIG. 4 shows an energy band diagram in the vertical plane from the active base region from the surface through the substrate of a transistor according to the first embodiment.

The $Si_{1-x}Ge_x$ layer results in a hetero-offset in both the conduction and valence bands relative to the substrate when grown commensurately on the silicon substrate (i.e. using the same lattice constant as silicon) The magnitudes of these band offsets are dependent on the fractional Ge content of the $Si_{1-x}Ge_x$ alloy. Representative energy band diagrams are shown in FIGS. 3 and 4, in which the $E_v$ and $E_c$ are the valence band energy and conduction band energy, respectively. FIG. 3 shows the band diagram in a plane extending laterally through the emitter-base-collector and in the Si—Ge alloy layer. FIG. 4 shows the corresponding diagram in a vertical plane from the surface through the active base region to the substrate.

The band alignment of strained $Si_{1-x}Ge_x$ to silicon is Type I, with most of the hetero-offset incorporated into the valence band. For example, for $x=0.25$ the conduction band offset, $\Delta E_c=0.02$ eV and $\Delta E_v=0.185$ eV (e.g. see reference by R. People, "Physics and applications of strained layer heterostructures", IEEE J. Quantum Electron. vol. 22 pp. 1696–1710 (1986)).

The incorporation of the $Si_{1-x}Ge_x$ layer in the active base region between the emitter and the collector of a lateral bipolar transistor enhances the carrier transport in the base and enhances the gain in a manner analogous to an conventional heterojunction transistor, i.e. a vertical configuration hetero-junction bipolar transistor (HBT) which comprises for example, a silicon-germanium base or silicon carbide emitter structure.

In a heterojunction transistor, the gain $\beta$ is proportional to $N_e/N_b \exp(\Delta E_v/kT)$, where $N_b$ and $N_e$ is the doping in the base and emitter respectively. With larger $\Delta E_v$, the gain increases exponentially.

The base transit time $\tau_b=W_b^2/2D_b$ where $W_b$ is the base width and $D_b$ is the diffusion constant for the alloy.

FIG. 3 illustrates the energy band diagram from the emitter to the collector along a plane which intersects the $Si_{1-x}Ge_x$ layer for the transistor of the first embodiment. This diagram is similar qualitatively to that for a conventional HBT however, it must be appreciated that in the lateral bipolar transistor described above, the transport enhancement comes about as a result of the presence of Ge which increases hole mobility and therefore diffusion across the base. Implanting and annealing the emitter and collector regions disorders the Si—Ge alloy structure, relieving strain and broadening the Ge content, so that the emitter and collector and composed collector are of wider bandgap alloy. In addition, in operation of the transistor, the junction between the emitter and the base is turned on more strongly at the interface between the large and small bandgap material thus reducing injection which is not coplanar with the collector. Thus overall emitter efficiency is improved. Even carriers not injected directly into the $Si_{1-x}Ge_x$ layer will be drawn towards it by the strain field associated with the lattice mismatch between the alloy and the substrate layer. That is, growing a $Si_{1-x}Ge_x$ layer commensurately, i.e. so that it matches the underlying lattice of the silicon substrate layer at the SiGe/Si interface, tetragonally distorts the crystal. In the plane of the interface on the alloy side, the atomic positions are compressed and on the silicon side they are expanded. Perpendicular to the interface on the alloy side the atomic positions are in extension compared to the bulk alloy. On the silicon side they are compressed. This distortion on both sides of the interface results in a strain field which narrows the bandgap of SiGe alloy, draws holes towards the valence band energy well of the $Si_{1-x}Ge_x$ layer, and valence band confinement keeps injected carriers in the alloy layer spanning the base region between the emitter and collector (see FIGS. 3 and 4).

In effect, as a result of the valence band hetero-offset there is a net diffusion of holes from the silicon to the $Si_{1-x}Ge_x$ layer. Diffusion in the opposing direction is inhibited by the energy wall at the interface.

Clearly, placing a layer of $Si_{1-x}Ge_x$ alloy in the plane linking the emitter and collector of a lateral PNP transistor has a number of beneficial effects on the performance of the device:

larger lateral gain as a result of hetero-offset.
  enhanced minority carrier transport (higher mobility as a result of the incorporation of Ge in the layer.
  improved emitter efficiency because the emitter base junction turns on more strongly at the interface between the wide bandgap emitter and narrow bandgap base.

Figure 5:
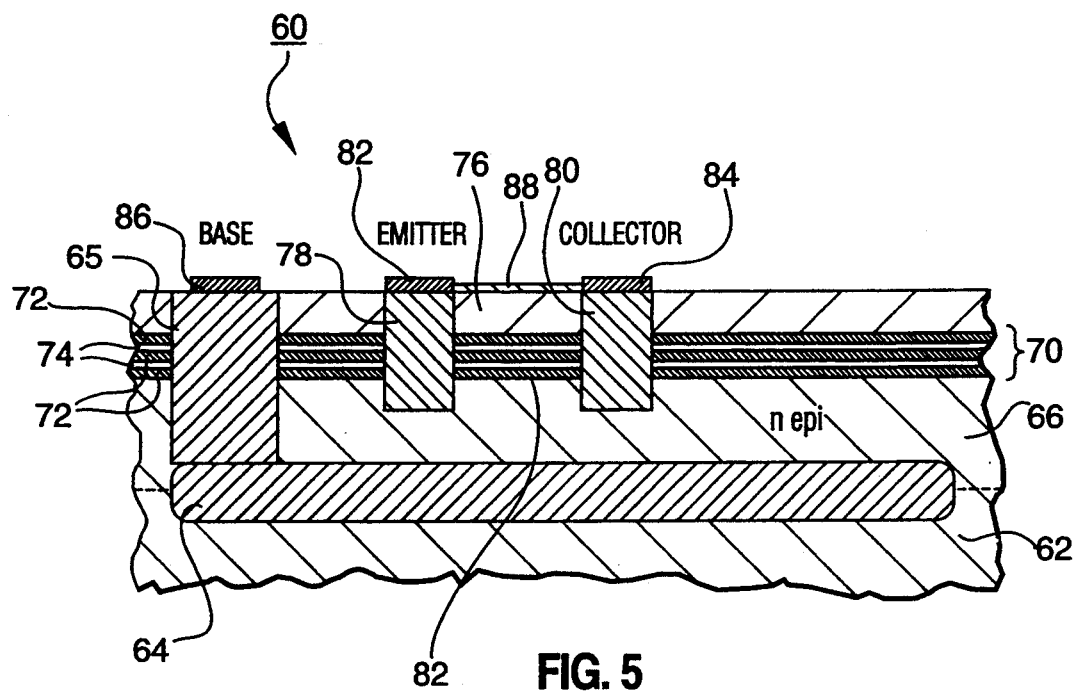
FIG. 5 shows schematic cross-sectional view through a lateral bipolar transistor comprising part of an integrated circuit according to a second embodiment of the present invention.
Figure 6:
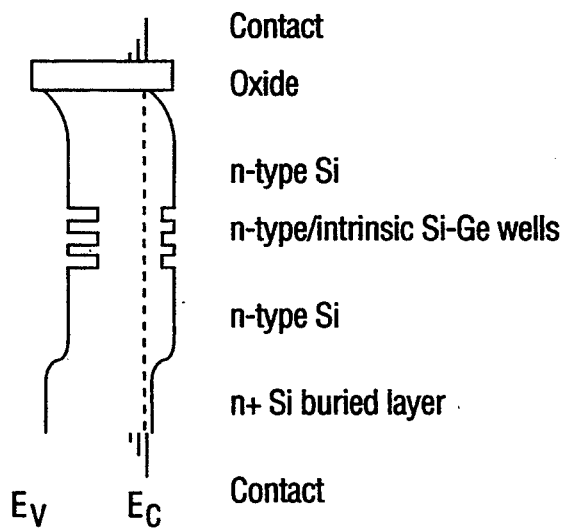
FIG. 6 shows an energy band diagram in the plane from the active base region, extending for the surface through the substrate, for a transistor according to the second embodiment.

A lateral bipolar transistor 60 comprising part of an integrated circuit according to a second embodiment is shown in FIG. 5. The lateral bipolar transistor 60 is formed on a semiconductor substrate 62 having an overlying lightly n doped epitaxial layer 64, and including a heavily n doped buried layer 66, similar to that of the first embodiment. However subsequent layers of the structure differ from the first embodiment in that the layer providing the base region, instead of comprising a single $Si_{1-x}Ge_x$ alloy layer, is provided as superlattice structure 70 comprising a single or multiple series of thin alternating layers 72 and 74 of $Si_{1-x}Ge_x$ and Si (FIG. 5). The superlattice structure 70 of the base region can be fabricated to provide an arbitrary band structure, in this case providing a hetero-offset in both the valence band and conduction band relative to the emitter and collector regions as shown in FIG. 6. The required band structure is accomplished by designing a superlattice structure comprising a series of alternating thin layers of a semiconductor alloy and a semiconductor, i.e. $Si_{1-x}Ge_x$ and Si, the thicknesses of the layers in a superlattice structure and their composition controlling the band structure and offsets, and the series of layers being selected to provide predetermined valence band and conduction band offsets, as required. A surface layer 76 of silicon is provided over the superlattice layers. Heavily doped regions forming an emitter 78 and collector 80 are defined by ion implantation, as described in the first embodiment. As mentioned above, implantation disorders the structure of the alloy layers in the emitter and collector regions. The heavily doped collector and emitter extend through the layers of the superlattice structure, and an active region 82 of the base is thus provided by that part of the superlattice structure extending between the emitter 78 and the collector 80. A thin gate dielectric layer 84 is provided on the silicon surface between the emitter and the collector.

The superlattice layers 72 and 74 are very thin, ~10 to 150 Å, and thus incorporate quantum effects. The band structure of the active base region provides enhanced minority carrier transport laterally through the base, similar to the effect in the transistor according the first embodiment. Quantum confinement effects in superlattice structures include discretization of the hole energy continuum, and hole mobility enhancement, effects which are well understood and described in the literature pertaining to reduced dimensionality structures.

Such thin layers of a semiconductor alloy may be grown without doping. Advantageously, the resulting transistor does not suffer base-width modulation, i.e. the Early effect, found in a conventional lateral transistor. Furthermore, undoped layers may have higher mobility because ionized impurity scattering is reduced.

In the transistor structure of the second embodiment, advantageously, a gate electrode (not shown) is provided overlying the surface silicon layer 76 between the emitter and collector, and separated therefrom by the thin dielectric layer 84, the latter thus acting a gate dielectric. The purpose of the gate electrode is to destroy the MOS channel which exists in the surface region 76 of the base linking the emitter and the collector, which would otherwise result in a surface leakage current. Whether or not a gate is necessary depends on the doping in the structure, and the resulting subthreshold current. By tying the emitter to the gate, thus turning off the surface MOSFET i.e. by controlling inversion in the channel region underlying the gate, surface leakage may be reduced.

The use of a gate electrode in a lateral bipolar transistor is described in more detail in co-pending U.S. Patent Application to Duljit Malhi et al, filed concurrently herewith.

Figure 7:
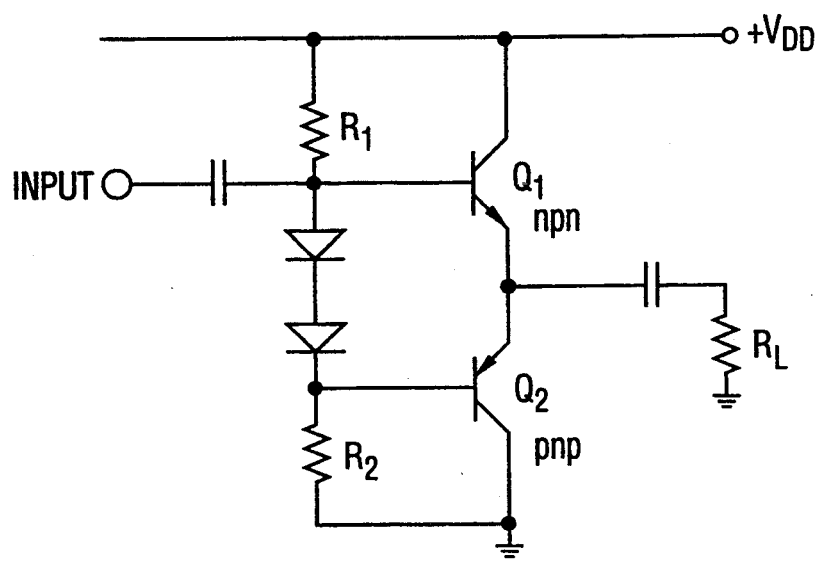
FIG. 7 shows a circuit diagram of a class AB complementary emitter follower output stage to illustrate a typical application of NPN and PNP lateral bipolar transistors according to the first embodiment of the present invention.

Although the embodiment described above relates to an pnp transistor, npn transistors may be fabricated correspondingly using elements of opposite conductivity type. A circuit diagram illustrating a typical application in a class AB complementary emitter follow out put stage of npn and pnp lateral bipolar transistors Q1 and Q2, is shown in FIG. 7

Transistors according to the first or second embodiments may be fabricated by methods compatible with conventional processes for fabrication of bipolar, and bipolar CMOS integrated circuits.

For example, in a method of forming the transistor 30 according to the first embodiment, a silicon substrate 32 is provided having a lightly doped N layer 36 epitaxially formed thereon in a conventional manner. A heavily doped buried layer 34 is then formed in a conventional manner, i.e. by selectively masking, by coating with photoresist and patterning, followed by ion implantation and annealing. A layer 38 of silicon germanium alloy is deposited on the substrate by a known method, e.g. by epitaxial growth of a silicon germanium alloy, or by formation of a layer of silicon followed by ion implantation of germanium and annealing. The silicon germanium layer 38 is provided having a composition $Si_{1-x}Ge_x$, the value of x being selected to provide a predetermined conduction band and valence band offset relative to the substrate as described above. Subsequently, emitter 44 and collector 46 regions are defined by ion implantation with a heavy dose of P type dopant (which disorders the lattice in these regions). A contact to the buried layer 36 is provided, in a conventional manner, through a heavily doped region 35 which extends down through layers 38 and 36 to contact the heavily doped buried region 34 which forms the buried base electrode. The latter heavy implants are preferably annealed by rapid thermal processing to avoid unwanted diffusion in the adjacent $Si_{1-x}Ge_x$ alloy layer. Electrically conductive contacts 50, 52, and 54 to the base, emitter and collector electrodes respectively are provided by conventional known processes.

Thus a lateral bipolar transistor according to the first embodiment may be provided by a method which is compatible with known VLSI processes for forming bipolar, CMOS and BiCMOS integrated circuits.

In other methods of fabricating a silicon heterojunction lateral bipolar transistor according to the first embodiment, may include alternative methods of forming the germanium silicon layer, e.g. as described in "A method of forming a germanium layer and a HBT" Verret et al. in U.S. Pat. No. 5,089,428, issued Feb. 18, 1992.

In successive steps of forming a transistor 60 according to the second embodiment, a substrate 62 is provided in the form of a conventional silicon semiconductor wafer, having a lightly doped N layer 66 formed epitaxially thereon. A heavily N+ doped layer 64 is formed in a region of the substrate, e.g. by ion implantation, to provide a buried base contact electrode in the substrate. Layers 72 and 74 forming the superlattice structure 70 are then deposited or grown epitaxially on the surface of the epitaxial layer to form a heterostructure including alternating thin layers, of lightly N doped silicon 74, a layer of a silicon germanium alloy 72, and another layer of lightly doped n type silicon 74. These layers 72 and 74 are deposited or grown epitaxially on a clean surface of the silicon substrate by any suitable known method, for example, UHV-CVD (ultra high vacuum-chemical vapor deposition) MBE (molecular beam epitaxy) or rapid thermal CVD.

A field isolation layer, e.g. an oxide layer, is provided selectively on the N silicon surface, by a known method, to define device well regions. A contact is provided from the surface to the buried N+ layer. The latter may be provided by ion implantation after selectively masking the surface with photoresist, thus forming of a heavily N+ doped sinker region 65. After stripping the implant photoresist mask, an oxidation step is performed to provide a thin layer of gate oxide. Then a polysilicon layer is deposited overall for defining gate electrodes of field effect transistors, and if required, a gate electrode for the lateral bipolar transistor.

First and second heavily N doped regions defining an emitter 78 and a collector 80 of bipolar transistors are then formed by ion implantation of a suitable N dopant, e.g. phosphorus ions, followed by annealing. Annealing is preferably accomplished by rapid thermal processing to minimize unwanted diffusion in the substrate. Simultaneously, the same implantation and annealing steps may be used to form corresponding heavily doped regions defining source and drain regions of field effect transistors, if required in other parts of a BiCMOS integrated circuit (not shown).

Low resistivity electrical contacts 82, 84 and 86 are provided to the emitter, collector and base electrodes of the bipolar transistors, (and to the gate electrode if required) and correspondingly to source, drain and gate electrodes of field effect transistors, by conventional known processing steps.

Various combinations of wide band gap and narrow bandgap semiconductors other than silicon and silicon germanium alloys may be used to form heterostructure lateral bipolar transistors if the semiconductor layers can be grown commensurately. Other semiconductors which may be suitable for forming heterostructure lateral bipolar transistors may include silicon carbide, semiconducting diamond and calcium fluoride.

Although particular embodiments of the invention have been described in detail, numerous modifications, variations and adaptations may be made without departing from the scope of the invention as defined in the claims.

What is claimed is:

1. A lateral bipolar transistor for an integrated circuit, comprising:
   a semiconductor layer of a first conductivity type comprising silicon and formed on a substrate;
   first and second heavily doped regions of a second conductivity type defined in the surface of the semiconductor layer and laterally spaced apart, said first and second heavily doped regions defining an emitter and a collector respectively of the lateral bipolar transistor;
   an active base region of the bipolar transistor comprising part of said semiconductor layer disposed between the emitter and collector, the active base region comprising at least one layer of a semiconductor alloy comprising silicon and germanium, extending laterally between the emitter and the collector and having a predetermined valence band offset relative to the heavily doped regions forming the emitter and collector, the semiconductor alloy layer also having a valence band offset relative to the underlying semiconductor layer, the resulting energy band structure of said alloy layer thereby providing for enhanced minority carrier transport laterally through the alloy layer between the emitter and the collector.

2. A lateral bipolar transistor according to claim 1 wherein the active base region comprises a semiconductor superlattice structure having a series of alternating layers of silicon and silicon-germanium alloy.

3. A lateral bipolar transistor according to claim 1 wherein the semiconductor alloy comprises $Si_{1-x}Ge_x$ with $1>x>0$ where x is selected to provide said predetermined valence band offset.

4. A lateral bipolar transistor according to claim 2 wherein the superlattice structure comprises at least one series of alternating thin layers of $Si_xGe_{1-x}$ and Si.

5. A lateral bipolar transistor according to claim 1 including a gate electrode overlying the base region and separated therefrom by a gate dielectric layer, for controlling inversion in the surface region under the gate, thereby reducing surface leakage current.

6. A lateral bipolar transistor according to claim 1 wherein a heavily doped buried base contact electrode of a first conductivity type is formed in a region of the substrate underlying the active base region.

7. An integrated circuit comprising a silicon heterojunction lateral bipolar transistor formed on a silicon semiconductor substrate having an emitter region and a collector region provided by laterally spaced apart regions comprising heavily doped silicon and a base region comprising a silicon germanium alloy extending laterally therebetween; said alloy having a valence band offset relative to an underlying substrate layer, the alloy thereby providing an energy band structure having a valence band energy well in the active base region to provide enhanced carrier transport through the alloy layer in a lateral direction between the emitter and collector.

8. An intergrated circuit according to claim 7 wherein the silicon-germanium alloy comprises $Si_xGe_{1-x}$, and $1 \geq x > 0$ where x is selected to provide a predetermined valence band offset.

9. An integrated circuit according to claim 7 wherein the silicon germanium alloy comprises at least one series of alternating thin layers of $Si_xGe_{1-x}$ and Si forming a SiGe superlattice structure.

10. An integrated circuit comprising a silicon heterojunction lateral bipolar transistor formed on a silicon semiconductor substrate, the transistor comprising,
    first and second laterally spaced apart regions defined in the surface of the substrate, said regions providing emitter and collector regions of the transistor comprising heavily doped silicon,
    and an active base region of the transistor disposed between the emitter and collector regions, the active base region comprising a semiconductor alloy having a predetermined valence band offset relative to the collector and emitter regions, and said alloy having valence band offset relative to an underlying substrate layer, the alloy thereby providing a energy band structure with a valence band energy well in the active base region to provide enhanced carrier transport through the alloy layer in a lateral direction between the emitter and collector.

* * * * *